United States Patent [19]

Thackeray et al.

[11] Patent Number: 5,968,712
[45] Date of Patent: Oct. 19, 1999

[54] RADIATION SENSITIVE COMPOSITIONS AND METHODS

[75] Inventors: James W. Thackeray, Braintree; Angelo A. Lamola, Sudbury, both of Mass.

[73] Assignee: Shipley Company, L.L.C., Marlborough, Mass.

[21] Appl. No.: 08/152,084

[22] Filed: Nov. 12, 1993

Related U.S. Application Data

[63] Continuation of application No. 07/778,729, Oct. 17, 1991, abandoned.

[51] Int. Cl.$^6$ ............................................. G03F 7/38
[52] U.S. Cl. ....................... 430/326; 430/270.1; 430/325; 430/327; 430/330
[58] Field of Search ................................... 430/330, 327, 430/323, 927, 176, 326, 917, 919, 325, 270, 270.1

[56] References Cited

U.S. PATENT DOCUMENTS

| | | | |
|---|---|---|---|
| 3,779,778 | 12/1973 | Smith et al. | 430/270.1 |
| 4,491,628 | 1/1985 | Ito et al. | 430/176 |
| 4,721,665 | 1/1988 | Dooley et al. | 430/196 |
| 4,775,609 | 10/1988 | McFarland | 430/325 |
| 4,810,613 | 3/1989 | Osuch et al. | 430/192 |
| 4,931,381 | 6/1990 | Spak et al. | 430/325 |
| 4,960,950 | 10/1990 | Durvasula | 568/587 |
| 5,087,547 | 2/1992 | Taylor et al. | 430/169 |
| 5,120,633 | 6/1992 | Bauer et al. | 430/176 |
| 5,320,931 | 6/1994 | Umehara et al. | 430/270 |
| 5,344,748 | 9/1994 | Feely | 430/330 |
| 5,693,609 | 12/1997 | Baker et al. | 514/3 |

FOREIGN PATENT DOCUMENTS

| | | |
|---|---|---|
| 0 292 821 | 11/1988 | European Pat. Off. . |
| 419147 | 3/1991 | European Pat. Off. . |
| 4124426 | 1/1992 | Germany . |

OTHER PUBLICATIONS

Patent & Trademark Office English–Language Translation of JP 63–149640 (Pub. Jun. 22, 1988).
CRC Handbook of Chemistry & Physics, 63rd Edition (1982–1983) p. D172.
Roberts, J.D. & M.C. Caserio, "Basic Principles of Organic Chemistry", W.A. Benjamin, Inc, NY (1964) pp. 880–881.
R.C. Weast, ed. CRC Handbook of Chemistry & Physics, 52 ed. 1971–1972 Edition, p. D117.
A. Lamola et al., "Chemically Amplified Resists", Solid State Technology, pp. 53–60 (1991).
Abstract of Japanese Patent 63–149637 (Jun. 22, 1988).
Abstract of Japanese Patent 63–149638 (Jun. 22, 1988).
Abstract of Japanese Patent 63–149639 (Jun. 22, 1988).
Abstract of Japanese Patent 63–149640 (Jun. 22, 1988).
Japanese Patent Application Laying Open (kokai) No. 2–296250, WPI Accession No. 91–031804 (Dec. 6, 1990).
Japanese Patent Application Laying Open (kokai) No. 1–300250 (Dec. 4, 1989).
Japanese Patent Application Laying Open (kokai) No. 2–118651 (May 2, 1990).
Japanese Patent Application Laying Open (kokai) No. 63–149640, WPI Accession No. 88–215340 (Jun. 22, 1988).
Japanese Patent Application Laying Open (kokai) No. 63–149639 (Jun. 22, 1988).
Japanese Patent Application Laying Open (kokai) No. 63–149638 (Jun. 22, 1988).
Japanese Patent Application Laying Open (kokai) No. 63–149637 (Jun. 22, 1988).
Japanese Patent Application Laying Open (kokai) No. 63–237053 (Oct. 3, 1988).
Japanese Patent Application No. 2–159786 [Laying Open (kokai) No. 4–51243] Feb. 19, 1992.
Japanese Patent Application No. 2–189209 [Laying Open (kokai) No. 4–75062] Mar. 10, 1992.
Japanese Patent Application No. 2–194147 [Laying Open (kokai) No. 4–80758] Mar. 13, 1992.

Primary Examiner—Janis L. Dote
Attorney, Agent, or Firm—Darryl P. Frickey; Peter F. Corless

[57] ABSTRACT

The present invention provides radiation sensitive compositions and methods that comprise novel means for providing relief images of enhanced resolution. In one aspect the invention provides a method for controlling diffusion of photogenerated acid comprising adding a polar compound to a radiation sensitive composition and applying a layer of the composition to a substrate; exposing the composition layer to activating radiation whereby a latent image is generated comprising a distribution of acid moieties complexed with the polar compound; and treating the exposed composition layer to provide an activating amount of acid.

6 Claims, No Drawings

RADIATION SENSITIVE COMPOSITIONS AND METHODS

This is a continuation of application Ser. No. 07/778,729 filed on Oct. 17, 1991, now abandoned.

BACKGROUND OF THE INVENTION

1. Introduction

The invention relates to radiation sensitive compositions such as photoresists that provide relief images of enhanced resolution. More particularly, the invention relates to compositions and methods that comprise novel means for treating photoacid-generating compositions to provide relief images of enhanced resolution and to control diffusion of photogenerated acid.

2. Background Art

Photoresists are used to form photosensitive films used for transfer of an image to a substrate. After a coating of a photoresist is formed on a substrate, the coating is selectively exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the resist coated substrate. Following exposure, the photoresist is developed to provide a relief image that permits selective processing of the substrate.

A photoresist can be either positive-acting or negative-acting. For most negative photoresists, those coating layer portions that are exposed to activating radiation polymerize or crosslink in a reaction between a photoactive compound and polymerizable reagents of the resist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

Following development of a photoresist coating, portions of the substrate bared by development may be altered such as by chemical etching or plating. The historical background, types and processing of conventional photoresists are described by DeForest, *Photoresist Materials and Processes*, McGraw Hill Book Company, New York, ch. 2, 1975, and by Moreau, *Semiconductor Lithography, Principles, Practices and Materials,* Plenum Press, New York, ch. 2 and 4, 1988, both incorporated herein for their teaching of photoresist compositions and methods of making and using the same.

Most commercial photoresist formulations, both positive and negative, comprise a film forming resin binder and a radiation sensitive component. Many of the film forming binders in use are phenolic resins. For example, most positive acting photoresists currently in commercial use comprise a novolak resin and a naphthoquinone diazide sulfonic acid ester photoactive compound where the novolak resin is the reaction product of formaldehyde and a phenol. Examples of such photoresists are disclosed in U.S. Pat. Nos. 4,377,631 and 4,404,272, both incorporated herein by reference. Another class of positive acting photoresists comprise a poly(vinylphenol) and a naphthoquinone diazide acid ester. Examples of these photoresists are disclosed in U.S. Pat. Nos. 3,869,292 and 4,439,516, both incorporated herein by reference.

Many negative acting photoresists also utilize phenolic resins as the film-forming component of the resist. For example, photoresist compositions of particular utility in high resolution deep-UV lithography have been developed based on the use of a photoacid generator sensitive to selective wavelengths of radiation, a crosslinking agent, and a phenolic, acid-hardening, polymeric binder. In these systems, radiation is used to cleave the photoacid generator, thus creating a strongly acidic environment. Upon subsequent heating (a processing step referred to as the "post exposure bake"), the generated acid activates the crosslinking agent to react with the phenolic binder and thereby form a base insoluble negative image (negative-tone resist). The acid acts as a catalyst for the crosslinking, i.e., there are many crosslinking events per unit of acid generated in the film. Resists that rely on acid catalysts, such as these acid-hardening resists, have been classified generally as "chemically amplified photoresists".

In addition to catalyzed crosslinking, other chemically amplified mechanisms are known, for example, catalyzed deprotection. Exemplary of such a system is a positive-tone resist comprising a phenolic resin, a radiation sensitive component which generates acid upon irradiation, and a dissolution inhibitor which is not photosensitive itself, but is chemically decomposed in an acid-catalyzed deprotection reaction. As with the above described negative-acting system, the acid catalyst is catalytic, inducing a series of deprotection reactions upon heating during the post exposure bake.

More specifically, a deprotection process can be represented by the following equations:

Acid Generation Reaction

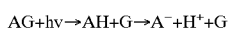

Deprotection Reaction

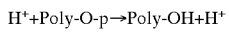

In the above reactions, the acid-generator (AG) molecule is converted to a strong acid (AH) upon absorption of a photon (hv), i.e., upon exposure to activating radiation. The acid proton affects the desired deprotection reaction of the protected polymer (Poly-O-p, where Poly-O is a hydroxyl-substituted polymer and p is a protecting group) to provide the deprotected polymer (Poly-OH) at a rate which is a function of the acid concentration [H$^+$], temperature, diffusion rate of the acid in the polymer matrix and the process environment. A crosslinking mechanism operates similarly, the acid proton affecting the reaction between the crosslinker and the reactive polymer of the composition.

Adequate resolution of a patterned image generally requires that the radiation generated acid concentration, [H$^+$], remain substantially constant within the exposed regions of a layer of the composition. The exposure process defines the latent image by transferring information to the resist coating layer by means of the phototool and the exposure radiation. This information is stored in the resist as photogenerated acid. Any loss of this information (i.e., acid) into unexposed regions of the resist, or into the substrate or environment can reduce the resolution of the transferred image.

In chemically amplified resists, it is generally important to have sufficient diffusion of photogenerated acid so that enough catalytic conversions occur to provide required photospeed. On the other hand and as discussed above, it is also important to limit diffusion of photogenerated acid to avoid information loss from exposed regions of a coating layer. Striking a satisfactory balance between these two objectives, however, can be difficult. Photogenerated acid often tends to diffuse into unexposed regions of a photoresist coating layer, or into the environment or the substrate. Upon subsequent heating during the post exposure bake, the acid-catalyzed reaction will occur in those unexposed regions where the acid has diffused, compromising resolution of the patterned image.

Methods for controlling diffusion of acid through an exposed photoresist layer have included redesign of the polymer matrix to provide large molecules to slow movement of the photogenerated proton, or to incorporate large molecules of photoacid compounds which generate large acid molecules. The use of large molecules has the disadvantage of decreasing the number of catalytic cycles for the chemically amplified process, thus decreasing the sensitivity of the resist.

Another method to control acid diffusion has been to limit the period between exposure and the post exposure bake. This can require design of relatively sophisticated and more costly interchanges between the phototool and baking apparatus.

SUMMARY OF THE INVENTION

The present invention provides radiation sensitive compositions and methods for treating such compositions, including methods for enhancing resolution of the relief image of a radiation sensitive composition and methods for controlling diffusion of photogenerated acid. The compositions of the invention may include various types of resin matrix systems and acid generators and comprise a means of effectively controlling loss of contrast due to the effects of acid diffusion during post exposure residence times. The compositions preferably comprise phenol-based resin systems. As used herein, the term "acid generator" refers to a compound capable of generating acid upon exposure to activating radiation.

The invention is based on the discovery that addition of certain polar compounds to a photoacid-generating composition provides enhanced resolution of images patterned in said compositions. It is believed the addition of such polar compounds results in the formation of a complex of the polar compound and photogenerated acid. By selecting an appropriate polar compound, an activating amount of acid is liberated from the complex during the post exposure bake to effect the desired acid-catalyzed reaction (e.g., deprotection or crosslinking). By complexing the photogenerated acid with the polar compound, diffusion of that acid out of exposed regions is prevented or at least significantly inhibited. Consequently the invention enhances resolution of a patterned image relative to prior systems, particularly when processing conditions impose delay between imaging and the post exposure bake.

Thus in one aspect the invention provides a method for treating a photoacid-generating composition comprising adding a suitable polar compound to the composition. In another aspect the invention provides the method of adding a polar compound to a radiation sensitive composition such as a photoresist and applying a layer of the composition to a substrate; exposing the composition layer to activating radiation whereby a latent image comprising acid moieties complexed with the polar compound is generated; and treating the exposed composition layer to provide an activating amount of acid from the complex. The exposed composition is preferably treated by heating the layer to a temperature sufficient to provide an activating amount of acid.

The polar compound has one or more moieties that can serve as a base and complex with the photogenerated acid at room temperature. Amines are preferred moieties. The polar compound should be compatible with the resist and resist processing conditions. For example, an effective amount of the polar compound preferably should remain in the radiation sensitive composition after any pre-exposure soft bake. Further, the polar compound should have an appropriate $pK_a$ so that an activating amount of acid is released from the formed complex during the post exposure bake. If the polar compound has a $pK_a$ value that is too high, sufficient acid may not be liberated from the acid-polar compound complex at post exposure bake temperatures and thereby inhibit or prevent the desired acid-catalyzed reaction. As discussed infra, effective amounts of the polar compound can vary with the basicity of the polar compound.

Novel articles of manufacture also are provided consisting of substrates coated the compositions of the invention.

The term "activating amount of acid" as used herein means an amount of acid sufficient to catalyze a desired reaction (e.g., deprotection or crosslinking) substantially throughout an exposed region of a coating layer of a photoacid-generating composition, and to thereby provide a solubility differential sufficient between exposed and unexposed regions of the coating layer to yield a relief image upon development.

The terms "crosslink" and "crosslinking" as used herein refer to any reaction of the crosslinking agent(s) of the compositions of the invention that results in reduced developer solubility. For example, the terms refer to, but are not limited to, any reaction that reduces the number of free phenolic hydroxyl sites of a phenol-based polymer, such as the reaction of a crosslinker agent with multiple hydroxyl sites as well as reaction of a crosslinker agent with a single hydroxyl site.

DETAILED DESCRIPTION OF THE INVENTION

The polar compounds useful in the invention are characterized by having one or more moieties that can complex with photogenerated acid. A complex of the polar compound and acid should release an activating amount of acid upon heating at temperatures of the post exposure bake to effect the desired acid-catalyzed reaction. Typically post exposure bake temperatures range from about 50° C. or greater. Hence a complex of photogenerated acid and the polar compound suitably releases an activating amount of acid at about 50° C. or greater. Post exposure bakes of 80° C., 100° C., 110° C., 120° C., 140° C. or greater are common; therefore release of an activating amount of acid at any of these temperatures or greater can be suitable.

It is common to perform a pre-exposure bake after coating a liquid photosensitive composition on a surface to remove solvents. Such a pre-exposure bake is typically conducted at temperatures of 90° C. or less. It is thus preferred that a sufficient amount of the polar compound remain disposed within a radiation sensitive composition, and not be volatilized, at such pre-exposure bake temperatures, so that an effective amount of the polar compound is present to complex with acid generated during imaging.

The polar compounds of the invention comprise one or more polar functional groups so that the compound is sufficiently basic to complex with photogenerated acid. Suitable polar functional groups include, for example, ether, ester, amide (including N-substituted amides and N-unsubstituted amides such as acetamide and urea) and amines. Amines have been found to be preferred polar moieties.

For the photogenerated acid-polar compound complex to release an activating amount of acid during post exposure bake temperatures, the $pK_a$ of the polar compound must be sufficiently low. As used herein, the term "$pK_a$" is used in accordance with its art recognized meaning, that is, $pK_a$ is the negative log (to the base 10) of the dissociation constant of the polar compound in aqueous solution at about room temperature.

Effective results can be achieved if the $pK_a$ of the polar compound is about 8.0 or less, although polar compounds having a $pK_a$ of greater than about 8.0 can be suitable (e.g., a $pK_a$ of about 9.0 or less) provided a sufficiently high temperature post-exposure bake is employed to release an activating amount of acid from the polar compound-photogenerated acid complex. Preferably, a polar compound is used that provides a $pK_a$ of about 7.0 or less, more preferably a $pK_a$ of about 4.0 or less, still more preferably a $pK_a$ of about 3.2 or less. It should be appreciated, however, that the environments in which the polar compounds of the invention are typically used, namely organic-based photoacid-generating compositions, are different than the aqueous solutions in which the above $pK_a$ values are determined. Hence, polar compounds having $pK_a$ values somewhat outside the above described preferred ranges also may be suitable for purposes of the invention.

It also should be appreciated that the weaker the basicity of the polar compound, relatively larger amounts of the polar compound may need to be added to a photoacid-generating composition to form a complex of the photogenerated acid and the polar compound. Conversely, the stronger the basicity of the polar compound, a relatively lower concentration of the polar compound will be required to form a complex of the photogenerated acid and the polar complex, and relatively lesser amounts of the polar compound can be added to a photoacid-generating composition to realize effective results, for example enhanced resolution of a patterned image of the composition.

As indicated above, amines are preferred polar compounds. Suitable amines will include, for example, aryl substituted amines including phenyl substituted amines such as 4-(p-aminobenzoyl) aniline, 4-benzyl aniline, 2-bromo aniline, o-chloro aniline, m-chloro aniline, 3,5-dibromo aniline, 2,4-dichloro aniline, N,N-dimethyl-3-nitro aniline, 2-fluoro aniline, 2-iodo aniline, 3-nitro aniline, 4-nitro aniline, 2-amino benzoic acid, 4-aminoazo benzene, 4-dimethylaminoazo benzene, n-diphenylamine, and phenyl glycine; cyclic amines (including nitrogen-containing aromatics) such as nicotine, 3-acetyl piperidine, proline, hydroxy proline, 2-amino-4-hydroxy pteridine, purine, 8-hydroxy purine, pyrazine, 2-methyl pyrazine, methylamino pyrazine, pyridazine, 2-amino pyrimidine, 2-amino-5-nitro pyrimidine, 3-bromo pyridine, 3-chloro pyridine, 2-hydroxy pyridine, 4-hydroxy pyridine, quinazoline, 8-carboxy quinoline, quinoaline, thiazole, and tryptophan; and aliphatic amines and substituted aliphatic amines (including carboxy-substituted aliphatic amines) such as arginine, aspartic acid, betaine, glycyl-2-amino-n-butyric acid, cystine, 1-glutamic acid, glycine, glycyl glycine, glycylglycyl glycine, leucyl glycine, methyl glycine, n-propyl glycine, tetraglycyl glycine, hexamethylene diamine, histidine, carnosine, 2-amino isobutyric acid, isoleucine, leucine, glycyl leucine, norleucine, ornithine, serine, threonine, methionine, glycylalanine, methoxy alanine, and threonine.

Relatively strong bases can form too strong a complex with photogenerated acid and, consequently, use of such bases can prevent release of an activating amount of acid at typical post exposure bake temperatures. Therefore less suitable polar compounds for purposes of the present invention are relatively strong bases that upon complexing with a photogenerated acid will not provide an activating amount of acid at typical post exposure bake temperatures. For example, bases having a $pK_a$ of about 9.0 or greater are less suitable for purposes of the subject invention, and thus are excluded from the preferred embodiments of the invention. Polar compounds having a $pK_a$ of about 10.0 or greater, or 11.0 or greater will be even less suitable; such strong bases will have limited utility in the processes of the invention, and thus are also excluded from the preferred embodiments of the invention. Such less suitable and strongly basic compounds include, for example, trialkylamines such as triethylamine; monoalkylamines such asethylamine, propylamine, butylamine, heptylamine, hexylamine, octylamine, and nonylamine; and other strong bases such as trimethylim-dine, 2-aminoethyl benzene, dimethyl glycine, and triamino propane.

The polar compounds of the invention may be used in both positive-acting and negative-acting radiation sensitive compositions, including positive-acting and negative-acting photoresists. Positive tone compositions are generally based on a two component system comprising a resin binder and an acid generator compound. A preferred resin binder is a phenol-based polymer. Negative tone compositions are typically three component systems comprising a resin binder, an acid generator compound and a crosslinking agent. As discussed, for a negative resist, the photogenerated acid catalyzes a reaction between the crosslinker and a reactive hydrogen containing material such as a phenol-based resin.

Phenol-based polymers useful for these acid-generating compositions are known in the art and typically comprise novolak and poly(vinylphenol) resins and copolymers of the same with styrene and alpha-methylstyrene. Novolak resins are thermoplastic condensation products of a phenol, a naphthol or a substituted phenol, such as, cresol, xylenol, ethylphenol, butylphenol, isopropyl methoxyphenol, chlorophenol, bromophenol, resorinol, naphthol, chloronaphthol, bromonaphthol or hydroquinone with formaldehyde, acetaldehyde, benzaldehyde, furfural acrolein, or the like. Suitable novolak resins are disclosed in U.S. Pat. Nos. 3,148,983; 4,404,357; 4,115,128; 4,377,631; 4,423,138; and 4,424,315, the disclosures of which are incorporated herein by reference.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons.

Another preferred phenol-based resin for the radiation sensitive compositions of the invention are copolymers of phenols and nonaromatic cyclic alcohols analogous in structure to the novolak resins and the poly(vinylphenol) resins. Such copolymers provide a radiation sensitive composition with relatively greater transparency to activating radiation. These copolymers may be formed in several ways. For example, in the conventional preparation of a poly (vinylphenol) resin, a cyclic alcohol may be added to the reaction mixture during the polymerization reaction which is thereafter carried out in normal manner. The cyclic alcohol is preferably aliphatic, but may contain one or two double bonds. The cyclic alcohol is preferably one closest in structure to phenol. For example, if the resin is poly (vinylphenol), the comonomer would be vinyl cyclohexanol.

The preferred method for formation of the copolymer comprises hydrogenation of a preformed novolak resin or a preformed poly(vinylphenol) resin. Hydrogenation may be carried out using art recognized hydrogenation procedures, for example, by passing a solution of the phenolic resin over a reducing catalyst such as a platinum or palladium coated carbon substrate or preferably over Raney nickel at elevated temperature and pressure. The specific conditions are dependent upon the polymer to be hydrogenated. More particularly, the polymer is dissolved in a suitable solvent such as ethyl alcohol or acetic acid, and then the solution is contacted with a finely divided Raney nickel catalyst and allowed to react at a temperature of from about 100 to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bonds in some of the phenolic units resulting in a random copolymer of phenolic and cyclic alcohol units randomly interspersed in the polymer in percentages dependent upon the reaction conditions used.

The mole percentage of cyclic alcohol units of the polymer should not exceed a level where development of the radiation sensitive composition is prevented following exposure of the composition to activating radiation. Thus, preferably the polymer has a major proportion of phenolic units and a minor proportion of cyclic alcohol units, more preferably the cyclic alcohol units vary from about 1 to 30 mole percent of the polymer binder, and still more preferably from about 5 to 15 mole percent of the polymer.

Other resins suitable for the practice of the invention include polymers made from polystyrene maleimides with pendant acid labile functionalities. Examples of useful polymers include those disclosed in U.S. Pat. Nos. 4,931,379, and 4,939,070, both incorporated herein by reference. Vinylic polymers containing recurrent pendant group are also useful and are disclosed in U.S. Pat. No. 4,491,628, incorporated herein by reference.

Another suitable resin is polyglutarimides, prepared according to U.S. Pat. No. 4,246,374, incorporated herein by reference, having a weight average molecular weight ranging from about 1000 to about 100,000 and which are soluble in aqueous base and contain at least 40 weight percent of the nitrogen atoms of the NH or ammonia form.

Another suitable resin binder for use in accordance with the invention are phenol-based polymers that are partially silylated. A preferred silylated polymer is disclosed in U.S. Pat. No. 4,791,171, incorporated herein by reference. This patent discloses partially silylated poly(vinylphenol) polymers prepared by derivatizing the phenolic hydroxide moieties of a poly(vinylphenol) with suitable organosilicon compounds. Such derivatization can be accomplished, for example, by condensation of a poly(vinylphenol) with an organosilicon compound that has a suitable leaving group, for example trimethylsilylmethylchloride, bromide, mesylate or tosylate; trimethylsilylchloride, bromide, cyanide or mesylate; phenyldimethylsilylchloride; or t-butyldimethylsilylchloride.

For the positive tone radiation sensitive compositions, preferred acid generators are naphthoquinone diazide sulfonic acid esters such as those disclosed by Kosar, *Light Sensitive Systems,* John Wiley & Sons, 1965, pp. 343 to 352, incorporated herein by reference. This group of acid generators form an acid in response to radiation of different wavelengths ranging from visible to X-ray. Thus, the generator compound chosen will depend, in part, upon the wavelengths used for exposure. By selecting the appropriate acid generator, the radiation sensitive compositions can be imaged by deep UV, E-beam, laser or any other activating radiation conventionally used for imaging photoresists. Specifically preferred acid generators include the 2,1,4-diazonaphthoquinone sulfonic acid esters and the 2,1,5-diazonaphthoquinone sulfonic acid esters.

Onium salts are also suitable acid generators for use in the compositions of the invention. Onium salts, with weakly nucleophilic anions are particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and B, Ia and B and I of the Periodic Table, for example, halonium salts, quaternary ammonium, phosphonium and arsonium salts, aromatic sulfonium salts and sulfoxonium salts or seleonium salts. Examples of suitable preferred onium salts can be found in U.S. Pat. Nos. 4,442,197; 4,603,101; and 4,624,912, all incorporated herein by reference.

A particularly suitable group of acid generating compounds useful in the compositions of the invention are the iodonium salts. A preferred group of such salts are those resulting from the condensation of aryliodosotosylates and aryl ketones as disclosed, for example, in U.S. Pat. No. 4,683,317, incorporated herein by reference.

Other useful acid generators include the family of nitrobenzyl esters, and the s-triazine derivatives. Suitable s-triazine acid generators are disclosed, for example, in U.S. Pat. No. 4,189,323, incorporated herein by reference.

Dissolution inhibitors compounds also may be added to the radiation sensitive compositions of the invention to further control dissolution of an exposed coating layer of the composition. Suitable dissolution inhibiting compounds include, for example, t-butyloxycarbonato-bis-phenol-A and t-butylacetoxy-bis-phenol-A. The dissolution inhibiting compounds may be suitably used in a concentration of about 5 to 10 weight percent of total solids of a radiation sensitive composition.

As noted above, negative acid-hardening resist systems generally comprise three components where photogenerated acid catalyzes a reaction between a crosslinker and a reactive hydrogen containing material such as a phenol-based resin. All of the above described resins are suitable as the reactive hydrogen containing material for the negative-acting compositions of the invention. Preferred are the above described novolak and poly(vinylphenol) resins. A particularly preferred resin for negative tone compositions is the above described phenol-based polymer that contains both phenolic and cyclic alcohol units.

In the negative resist systems, amine-based crosslinkers are preferred. Suitable amine-containing crosslinkers include urea-formaldehyde, melamineformaldehyde, benzoguanamine-formaldehyde, glycoluril-formaldehyde resins and combinations thereof. Other suitable amine-based crosslinkers include the melamines manufactured by American Cyanamid Company such as Cymel® 300, 301, 303, 350, 370, 380, 1116 and 1130; benzoguanamine resins such as Cymel® 1123 and 1125; glycoluril resins Cymel® 1170, 1171, 1172; and urea-based resins Beetle® 60, 65 and 80. A large number of similar amine-based compounds are presently commercially available from various suppliers. As known to those in the art, polymeric amine-based resins may be prepared by the reaction of acrylamide or methacrylamide copolymers with formaldehyde in an alcohol-containing solution, or alternatively by the copolymerization of N-alkoxymethyl acrylamide or methacrylamide with other suitable monomers.

Of the above crosslinkers, the melamines are preferred, and particularly preferred are hexaalkoxymethylmelamines such as the above identified Cymel resins.

The amine-based crosslinker and phenol-based polymer are used in combination with an acid generator. Non-ionic, organic acid generators are particularly suitable for the negative-acting compositions of the invention. Particularly preferred non-ionic organic acid generators are halogenated non-ionic compounds such as, for example, 1,1-bis[p-chlorophenyl]-2,2,2-trichloroethane (DDT);
1,1-bis[p-methoxyphenyl]-2,2,2-trichloroethane (methoxychlor®); 1,2,5,6,9,10-hexabromocyclododecane;
1,10-dibromodecane; 1,1-bis[p-chlorophenyl]2,2-dichloroethane;
4,4'-dichloro-2-(trichloromethyl)benzhydrol or 1,-bis(chlorophenyl)-2-2,2-trichloroethanol (Kelthane®);
hexachlorodimethylsulfone; 2-chloro-6-(trichloromethyl)pyridine;
O,O-diethyl-O-(3,5,6-trichloro-2-pyridyl)phosphorothioate (Dursban®);
1,2,3,4,5,6-hexachlorocyclohexane; N(1,1-bis[p-chlorophenyl]-2,2,2-trichloroethylacetamide;
tris[2,3-dibromopropyl]isocyanurate;
2,2-bis[p-chlorophenyl]-1,1-dichloroethylene; and their isomers, analogs, homologs and residual compounds. Suitable photoacid generators are also disclosed in European Patent Application Nos. 0164248 and 0232972, both incorporated herein by reference.

Residual compounds are intended to include closely related impurities or other modifications of the above halogenated organic compounds which result during their synthesis and which may be present in minor amounts in commercial products containing a major amount of the above compounds.

Acid generators that are particularly preferred for deep UV exposure (i.e., about 100 to 300 nm) include 1,1-bis(p-chlorophenyl)-2,2,2-trichloroethane (DDT); 1,1-bis(p-methoxyphenol)-2,2,2-trichloroethane; 1,1-bis (chlorophenyl)-2,2,2-trichloroethanol; tris(1,2,3-methanesulfonyl)benzene; and tris(trichloromethyl) triazine.

For negative-tone resist systems, the amine-based crosslinking agent may be used as the basic substance to enhance resolution of a relief image of the resist. Again, the basicity of the crosslinking agent should be such that the base holds the generated photoacid at room temperature and then releases an activating amount of acid at the elevated temperatures of the post-exposure bake. Suitable crosslinkers that will release at least some photogenerated acids at post exposure bake temperatures include the melamine-formaldehyde resins such as highly methylated melamine-formaldehyde, partially methylated melamine-formaldehyde, and mixed ether and butylated melamine resins. Of these melamine-formaldehyde resins, Cymel 303 (as commercially available from American Cyanamid Co.) is specifically preferred.

It has been found that photoacid-generating compositions can provide well resolved relief images, even with extended time delays between the exposure and post exposure bake processing steps, where the compositions comprise crosslinking agents of hexamethoxymethylmelamine (sometimes referred to herein as "HMMM"), hydrolyzed derivatives of HMMM which contain free amine moieties, and condensation products of HMMM including dimers and trimers of HMMM. Such HMMM derivatives have been described in J. H. Dijk, et al., *Proc. XVtL FATIPEC Congr.*, *II*, 326 (1980), incorporated herein by reference. It has also been found that when a pure sample of HMMM is used as the sole crosslinking agent (i.e., in the absence of any hydrolyzed HMMM derivatives or HMMM condensation products) in a photoacid-generating composition, a relief image is provided having inferior resolution relative to the resolution of a relief image formed from a generally comparable composition that comprises HMMM, hydrolyzed HMMM derivatives, and HMMM condensation products. This is believed to indicate that an unhydrolyzed monomer of HMMM does not complex with photogenerated acid and thus does not limit diffusion of photogenerated acid. In turn, it is believed this result indicates that hydrolyzed HMMM derivatives and/or HMMM condensation products such as dimers and trimers of HMMM effectively complex with photogenerated acid, and that an activating amount of acid is liberated from said complex at post exposure bake temperatures. Hence a preferred negative acting radiation sensitive composition in accordance with the invention comprises HMMM, HMMM condensation products, and hydrolyzed derivatives of HMMM that contain one or more amine groups that can effectively complex with photogenerated acid. It is noted that Cymel 303 as obtained from the American Cyanamid Co. comprises HMMM as well as both hydrolyzed derivatives of HMMM which contain one or more amine groups and HMMM condensation products such as dimers and trimers of HMMM.

To enhance resolution of a patterned resist image, a polar compound of the above described type may also be used in combination with a crosslinking agent such as a melamine-formaldehyde resin. The term "complexing polar compound", or in the specific case of an amine a "complexing amine", is defined to mean herein a polar compound of the invention as described above, used in combination with and in addition to any conventional components of a radiation sensitive composition. For example, in a positive-acting composition, a complexing polar compound will be a component of the composition other than the resin binder, acid generator and any other conventional additives such as conventional dyes and conventional sensitizers for expanding the composition's spectral response. In a negative-acting composition a complexing polar compound will be a component of the composition other than a melamine resin or other primary crosslinker, resin binder, acid generator, conventional sensitizers, conventional dyes or other conventional components of the composition. Amines are preferred complexing polar compounds for use in combination with the primary crosslinking agent in a negative photoresist, and particularly preferred is a negative photoresist that comprises a complexing polar compound of an imidazole in combination with a primary crosslinker of a melamine resin.

Negative photoresists that employ a melamine crosslinker and phenol-based resin binder often provide somewhat limited resolution with many acid generators that produce hydrogen halides (e.g., HBr) upon photoactivation. Exemplary hydrogen halide generators include tris[2,3-dibromopropyl]isocyanurate. Such resolution problems are believed to result at least in part from diffusion of the photogenerated hydrogen halide into unexposed regions during the interval between exposure and the post exposure bake crosslinking reaction. By incorporating a suitable polar compound into such a photoresist composition that contains a hydrogen halide-generator compound, resolution improves. Preferred polar compounds for addition to a resist that contains a hydrogen halide-generator compound include the above described amines.

The compositions of the invention are generally prepared following prior art procedures for the preparation of photoresists and other photocurable compositions. For a liquid coating composition, the solids portion of the composition is conventionally dissolved in a solvent. The solvent used does not constitute a part of the invention. However, for purposes of exemplification, useful solvents include glycol ethers, such as ethylene glycol monomethyl ether, ethylene glycol monoethyl ether, ethylene glycol dimethyl ether, methoxy benzene and the like; Cellosolve® esters such as methyl Cellosolve acetate, ethyl Cellosolve acetate and propylene glycol monomethyl ether acetate; aromatic hydrocarbons such as toluene, xylene and the like; ketones such as acetone, methyl ethyl ketone, cyclopentanone, cyclohexanone; esters such as ethyl acetate, butyl acetate, hexyl acetate, isobutyl isobutyrate and butyl lactone; amides such as dimethylacetamide, N-methyl pyrrolidione and dimethyl formamide; chlorinated hydrocarbons such as methylene chloride, ethylene dichloride, 1,1,1-trichloroethane, chlorobenzene and ortho-dichlorobenzene; nitrobenzene; dimethyl sulfoxide; alcohols such as diacetone alcohol; and mixtures of the foregoing.

Effective results (e.g., enhanced resolution of a relief image) can be achieved if one or more polar compounds of the above described type is added to a conventional photoresist composition in an amount of from about 0.05 to 5.0 weight percent, although it should be clear that effective amounts may vary with the particular composition and polar compound(s) that are employed.

The total solids content of the liquid coating compositions of the invention should not exceed about 60 percent by weight of the formulation and preferably, the solids content varies between about 10 and 50 percent by weight of the total composition.

The compositions of the invention are used in a conventional manner and for conventional purposes. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The compositions of the invention are applied to substrates conventionally used in processes involving coating with photoresists. For example, the compositions of the invention may be applied over silicon or silicon dioxide wafers for the production of microprocessors and other integrated circuit components. Aluminum-aluminum oxide and silicon nitride wafers can also be coated with the compositions of the invention. Another suitable use of the compositions of the invention is as a planarizing layer or for formation of multiple layers in accordance with art recognized procedures.

For typical photoresist applications, following coating of a composition of the invention onto a surface, it is subjected to a pre-exposure soft bake, i.e. heated to about 90° C. to remove the solvent until preferably the resist coating is tack free. Thereafter, it is imaged through a mask in conventional manner. The exposure is sufficient to effectively activate the photoactive component of the resist system to produce a patterned image in the resist coating layer and, more specifically, the exposure energy typically ranges from about 10 to 300 mJ/cm$^2$, dependent upon the exposure tool. The wavelength of activating radiation will, of course, vary with the photoactive components of a given radiation sensitive composition and will be known to those skilled in the art. The spectral response of a radiation sensitive composition can be expanded by the use of suitable radiation sensitizer compounds.

Following exposure, the composition is preferably baked at temperatures ranging from about 50° C. to about 140° C. to release an activating amount of acid from the complex of the polar compound and the photogenerated acid, and effect the acid-catalyzed reaction. Preferably the activating amount of acid released from the polar compound-photogenerated acid complex during post exposure bake is sufficient to catalyze a reaction that results in a solubility differential of preferably at least about 10:1, more preferably at least about 100:1, between exposed and unexposed regions of a coating layer of the radiation sensitive composition. Thereafter, the film is developed, preferably with an aqueous based developer such as an inorganic alkali exemplified by sodium hydroxide, potassium hydroxide, sodium carbonate, sodium bicarbonate, sodium silicate, sodium metasilicate, aqueous ammonia or the like. Alternatively, organic developers can be used such as choline based solutions; quaternary ammonium hydroxide solutions such as a tetra-alkyl ammonium hydroxide solution; various amine solutions such as ethyl amine, n-propyl amine, diethyl amine, di-n-propyl amine, triethyl amine or methyldiethyl amine; alcohol amines such as diethanol amine or triethanol amine; cyclic amines such as pyrrole, piperidine, etc. In general, development is in accordance with art recognized procedures.

Following development, a bake at temperatures of from about 100° C. to about 250° C. for several minutes may be employed if desired.

The substrate bared in an image pattern by development of the photoresist layer may then be selectively processed, for example by chemically etching or by plating in accordance with procedures well known in the art. For the manufacture of microelectronic substrates, for example the manufacture of silicon dioxide wafers, suitable etchants include a plasma gas etch and a hydrofluoric acid etching solution. The compositions of the invention are highly resistant to such etchants thereby enabling manufacture of highly resolved features, including lines with submicron widths. After such processing, the composition mask may be removed from the processed substrate using known stripping procedures.

The following examples are presented to better illustrate the invention, but are not to be construed as limiting the invention to the specific embodiments disclosed.

Throughout the examples, the partially hydrogenated poly (p-vinylphenol) resins were obtained from Maruzen Oil, Co. of Tokyo, Japan. The degree of hydrogenation of these poly(p-vinyl phenols) is expressed as % of aromatic double bonds converted to single bonds, or equivalently as % of hydroxyphenyl groups converted to hydroxycyclohexyl groups. All temperatures throughout this disclosure are in degrees Celsius.

EXAMPLE 1

A photoresist composition was prepared consisting of 10 g of poly(p-vinyl)phenol (hereafter "PVP") at a 10% level of hydrogenation, 2 g of t-butyloxycarbonato-bis-phenol-A and 1.5 g of tris(1,2,3-methane-sulfonyl) benzene dissolved in 27.5 g of diethylene glycol dimethyl ether. This resist formulation was coated to 1.0 micron thickness on three separate silicon wafers (hereafter "the first wafer", "second wafer" and "third wafer") using a conventional spin coater. The wafers were each soft baked at 90° C. for 1 minute, and then exposed for 10 seconds on an HTG deep UV exposure unit with a variable optical density mask placed between the source and the wafer. The first wafer was subjected to a time delay between exposure and post exposure bake of 5 minutes; the second wafer was subjected to a time delay of 120 minutes; and the third wafer was subjected to a time delay of 24 hours between exposure and post exposure bake. All three wafers were post exposure baked at 120° C. for 1 minute. The three wafers were then batch developed in MF-321 (tetramethylammonium hydroxide sold by Shipley Company of Newton, Mass.) for 60 seconds. For the first and second wafers with delay times of 5 and 60 minutes, respectively, the contrast curves overlapped. For the third wafer stored for 24 hours, it was observed that the resist slowed down as a function of the delay between exposure and post exposure bake. Further, in the case of the third wafer, the photoresist became, for practical purposes, insoluble in the developer. While not wishing to be bound by theory, it is believed this result indicates slow diffusion of acid in the unexposed areas leading to lower concentration of acid in the exposed areas during the bake step and thereby decreasing the number of blocked sites deprotected in the exposed areas.

EXAMPLE 2

0.1 g of triisopropanol amine was added to 50 g of the photoresist composition prepared in Example 1. This photoresist was coated on three separate silicon wafers and processed by the same procedures as described in Example 1. The third wafer subjected to a time delay of 24 hours between exposure and post exposure bake showed no change in the contrast curve relative to the first and second wafers subjected to the shorter time delays. It is believed this result indicates that the base complexes with the photogenerated acid, confining the acid to exposed areas to provide a sufficient acid concentration to deprotect the t-Boc sites during the post exposure bake.

EXAMPLE 3

A photoresist composition was prepared by mixing 10 g of PVP at 10% hydrogenation, 0.75 g of purified hexamethoxymethylmelamine, and 0.5 g tris (trichloromethyl)triazine dissolved in 28.25 g diethylene glycol dimethyl ether. The resist was coated to 1.0 micron thickness on three separate silicon wafers using a conventional spin coater. The wafers were then baked at 90° C. for 1 minute, and then exposed on a GCA ALS Laserstep 5:1 excimer laser stepper. The first wafer was subjected to a time delay between exposure and post exposure bake of 5 minutes; the second wafer was subjected to a time delay of 120 minutes; and the third wafer was subjected to a time delay of 24 hours. All three wafers were post exposure baked at 130° C. for 1 minute. The wafers were batch developed in 0.135 N MF-312 (tetramethyl ammonium hydroxide) for 150 seconds. As a measure of diffusion, the changes in linewidth of a 0.5 micron feature were observed during the time delay between exposure and post exposure bake. The line width change increased with increasing time delay between exposure and post exposure bake. For the wafer subjected to the 24 hour time delay, the 0.5 micron linewidth was reduced to 0.2 micron. While again not wishing to be bound by theory, it is believed this loss of linewidth resulted from diffusion of acid into the unexposed regions of the resist coating layer, leading to less acid in the exposed areas and hence linewidth shrinkage as if the resist layer had been underexposed.

EXAMPLE 4

A photoresist composition was prepared by adding 0.1 g of 2-methylimidazole to 50 g of the photoresist composition prepared in Example 3. This imidazole photoresist composition was coated on three separate silicon wafers and processed by procedures the same as those described in Example 3 with time delays between exposure and post exposure bake of 5 minutes, 120 minutes and 24 hours for the first, second and third wafers, respectively. Upon development, no linewidth loss for any of the three wafers was observed. This result is believed to demonstrate that the imidazole base complexes with the photogenerated acid at room temperature, confining the acid to exposed regions of the resist layer.

The foregoing description of the invention is merely illustrative thereof, and it is understood that variations and modifications can be effected without departing from the scope or spirit of the invention as set forth in the following claims.

What is claimed is:

1. A method for forming a photoresist image on a substrate, the method comprising:
    (a) providing a chemically amplified positive tone photoresist, the photoresist comprising a resin binder, a photoacid-generating compound and a sufficient amount of an aliphatic amine other than a trialkyl amine having a $pK_a$ not exceeding 9.0 and of sufficient basicity to complex with acid generated by exposure of the photoresist to activating radiation;
    (b) forming a layer of the photoresist on the substrate, exposing the photoresist layer to an image pattern of activating radiation to liberate acid in the exposed areas of said photoresist layer and complex the same with the aliphatic amine;
    (c) heating the exposed photoresist layer to a temperature sufficient to liberate a catalyzing amount of acid from the complex of the acid and aliphatic amine to create areas of differential solubility within the photoresist layer and developing the heated exposed layer with a developer for the photoresist layer to form a photoresist relief image.

2. The method of claim 1 where the $pK_a$ of the aliphatic amine does not exceed 8.0.

3. The method of claim 1 where the $pK_a$ of the aliphatic amine does not exceed 4.0.

4. The method of claim 1 where the $pK_a$ of the aliphatic amine does not exceed 3.2.

5. The method of claim 1 wherein the photoresist layer is heated at 90° C. or less after the forming and prior to the exposing, and the aliphatic amine is not volatized from the photoresist layer during the heating at 90° C. or less.

6. The method of claim 1 further comprising metallizing or etching substrate areas bared by development of the photoresist layer.

* * * * *